(12) United States Patent
Fuentes et al.

(10) Patent No.: US 8,946,886 B1
(45) Date of Patent: Feb. 3, 2015

(54) SHIELDED ELECTRONIC COMPONENT PACKAGE AND METHOD

(75) Inventors: Ruben Fuentes, Gilbert, AZ (US);
August Joseph Miller, Jr., Queen Creek, AZ (US)

(73) Assignee: Amkor Technology, Inc.

( * ) Notice: Subject to any disclaimer, the term of this patent is extended or adjusted under 35 U.S.C. 154(b) by 640 days.

(21) Appl. No.: 12/779,784

(22) Filed: May 13, 2010

(51) Int. Cl.
*H01L 23/10* (2006.01)
*H01L 23/34* (2006.01)

(52) U.S. Cl.
USPC ........... 257/706; 257/678; 257/698; 257/700; 257/704; 257/707; 257/710; 257/712; 257/720; 257/774; 257/782; 257/787; 257/E23.011; 257/E23.019; 257/E23.02; 257/E23.116; 438/106; 438/118; 438/121; 438/124; 438/127

(58) Field of Classification Search
USPC ......... 257/678, 687, 698, 700, 704–707, 710, 257/712, 720, 774, 782, 783, 787, E23.011, 257/E23.019, E23.02, E23.116; 438/106, 438/118, 121, 122, 124, 127
See application file for complete search history.

(56) References Cited

U.S. PATENT DOCUMENTS

| | | | |
|---|---|---|---|
| 4,925,024 A | 5/1990 | Ellenberger et al. |
| 5,166,772 A | 11/1992 | Soldner et al. |
| 5,416,358 A | 5/1995 | Ochi et al. |
| 5,468,999 A | 11/1995 | Lin et al. |
| 5,473,191 A | 12/1995 | Tanaka |
| 5,557,142 A | 9/1996 | Gilmore et al. |
| 5,614,694 A | 3/1997 | Gorenz, Jr. et al. |
| 5,639,989 A | 6/1997 | Higgins, III |
| 5,656,864 A | 8/1997 | Mitsue et al. |
| 5,694,300 A | 12/1997 | Mattei et al. |
| 5,907,477 A | 5/1999 | Tuttle et al. |
| 5,940,271 A | 8/1999 | Mertol |
| 6,136,131 A | 10/2000 | Sosnowski |
| 6,194,655 B1 | 2/2001 | Lange, Sr. et al. |
| 6,246,115 B1 | 6/2001 | Tang et al. |
| 6,423,570 B1 | 7/2002 | Ma et al. |
| 6,433,420 B1 | 8/2002 | Yang et al. |
| 6,465,280 B1 | 10/2002 | Martin et al. |

(Continued)

OTHER PUBLICATIONS

Scanlan et al., "A Semiconductor Device Having EMI Shielding and Method Therefor", U.S. Appl. No. 11/754,209, filed May 25, 2007.

(Continued)

*Primary Examiner* — Meiya Li
(74) *Attorney, Agent, or Firm* — McAndrews, Held & Malloy, Ltd.

(57) ABSTRACT

An electronic component package includes a substrate having a first surface, an electronic component mounted to the substrate, traces on the first surface, a terminal on the first surface, and a solder mask on the first surface. The solder mask includes a solder mask opening exposing the terminal. An electrically conductive coating and/or conductive coating feature is formed on the solder mask and extends into the solder mask opening to contact and be electrically connected to the terminal. The conductive coating may be grounded to shield the electronic component from electromagnetic interference (EMI). Further, the conductive coating provides a ground plane for the traces facilitating impedance matching of signals on the traces. In addition, the conductive coating has a high thermal conductivity thus enhancing heat dissipation from the electronic component. The conductive coating feature can be used as a conductive path to transmit electrical signals and/or to form circuit patterns that can be used as passive devices.

18 Claims, 19 Drawing Sheets

(56) References Cited

U.S. PATENT DOCUMENTS

| | | | |
|---|---|---|---|
| 6,528,876 B2 * | 3/2003 | Huang | 257/706 |
| 6,602,737 B2 | 8/2003 | Wu | |
| 6,686,649 B1 | 2/2004 | Mathews et al. | |
| 7,030,469 B2 | 4/2006 | Mahadevan et al. | |
| 7,049,682 B1 | 5/2006 | Mathews et al. | |
| 7,071,550 B2 * | 7/2006 | Sato | 257/706 |
| 7,342,303 B1 | 3/2008 | Berry et al. | |
| 7,629,674 B1 | 12/2009 | Foster | |
| 7,633,765 B1 | 12/2009 | Scanlan et al. | |
| 7,745,910 B1 | 6/2010 | Olson et al. | |
| 7,868,462 B2 | 1/2011 | Choi et al. | |
| 7,888,183 B2 | 2/2011 | Liu et al. | |
| 2002/0089832 A1 | 7/2002 | Huang | |
| 2003/0057545 A1 * | 3/2003 | Shim et al. | 257/706 |
| 2003/0067757 A1 | 4/2003 | Richardson et al. | |
| 2005/0073038 A1 * | 4/2005 | Kuo et al. | 257/690 |
| 2005/0280139 A1 | 12/2005 | Zhao et al. | |
| 2006/0208347 A1 * | 9/2006 | Kim | 257/678 |
| 2007/0030661 A1 | 2/2007 | Morris et al. | |
| 2009/0146268 A1 * | 6/2009 | Huang et al. | 257/659 |
| 2010/0289716 A1 | 11/2010 | Lenzi et al. | |

OTHER PUBLICATIONS

Adlam et al., "A Semiconductor Device Having RF Shielding and Method Therefor", U.S. Appl. No. 11/942,254, filed Nov. 19, 2007.

Berry et al., "A Semiconductor Device Having RF Shielding and Method Therefor", U.S. Appl. No. 11/971,577, filed Jan. 9, 2008.

Bolognia, "A System and Method to Reduce Shorting of Radio Frequency (RF) Shielding", U.S. Appl. No. 12/107,478, filed Apr. 22, 2008.

Naval et al, "A Semiconductor Device Having EMI Shielding and Method Therefor", U.S. Appl. No. 12/335,365, filed Dec. 15, 2008.

Scanlan, "A System and Method for Shielding of Package on Package (PoP) Assemblies", U.S. Appl. No. 12/342,829, filed Dec. 23, 2008.

Bolognia et al., "Reversible Top/Bottom Package", U.S. Appl. No. 12/397,470, filed Mar. 4, 2009.

Davis et al., "Conformal Shielded on Punch QFN Semiconductor Package", U.S. Appl. No. 12/398,089, filed Mar. 4, 2009.

Yoshida et al., "Stackable Protruding Via Package and Method", U.S. Appl. No. 12/474,009, filed May 28, 2009.

Yoshida et al., "Stackable Via Package and Method", U.S. Appl. No. 12/483,913, filed Jun. 12, 2009.

Fuentes et al., "A System and Method for RF Shielding of a Semiconductor Package", U.S. Appl. No. 12/502,409, filed Jul. 14, 2009.

Foster, "Shielded Package Having Shield Lid", U.S. Appl. No. 12/589,500, filed Oct. 23, 2009.

Darveaux, "Flex Circuit Package and Method", U.S. Appl. No. 12/692,397, filed Jan. 22, 2010.

Chun et al., "Top Feature Package and Method", U.S. Appl. No. 12/708,033, filed Feb. 18, 2010.

Chun et al., "Shield Lid Interconnect Package and Method," U.S. Appl. No. 13/475,469, filed May 18, 2012.

* cited by examiner

US 8,946,886 B1

SHIELDED ELECTRONIC COMPONENT PACKAGE AND METHOD

TECHNICAL FIELD

The present application relates to the field of electronics, and more particularly, to methods of forming electronic component packages and related structures.

BACKGROUND

Electromagnetic interference (EMI) occurs when electromagnetic radiation interferes with the proper operation of an electronic component. Accordingly, it is desirable to shield the electronic component from electromagnetic interference.

BRIEF DESCRIPTION OF THE DRAWINGS

In the following description, the same or similar elements are labeled with the same or similar reference numbers.

DETAILED DESCRIPTION

Figure 3:
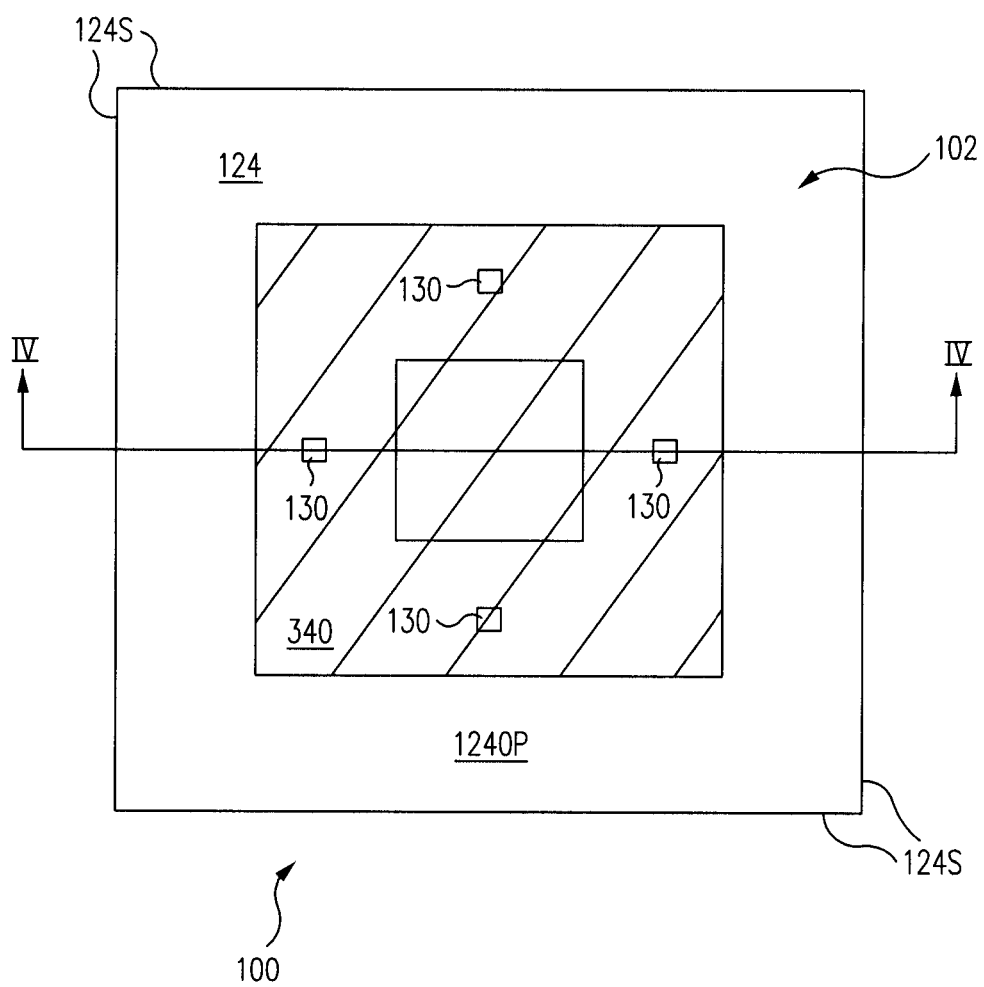
FIG. 3 is a top perspective view of the shielded electronic component package of FIG. 1 at a later stage during fabrication in accordance with one embodiment.
Figure 4:
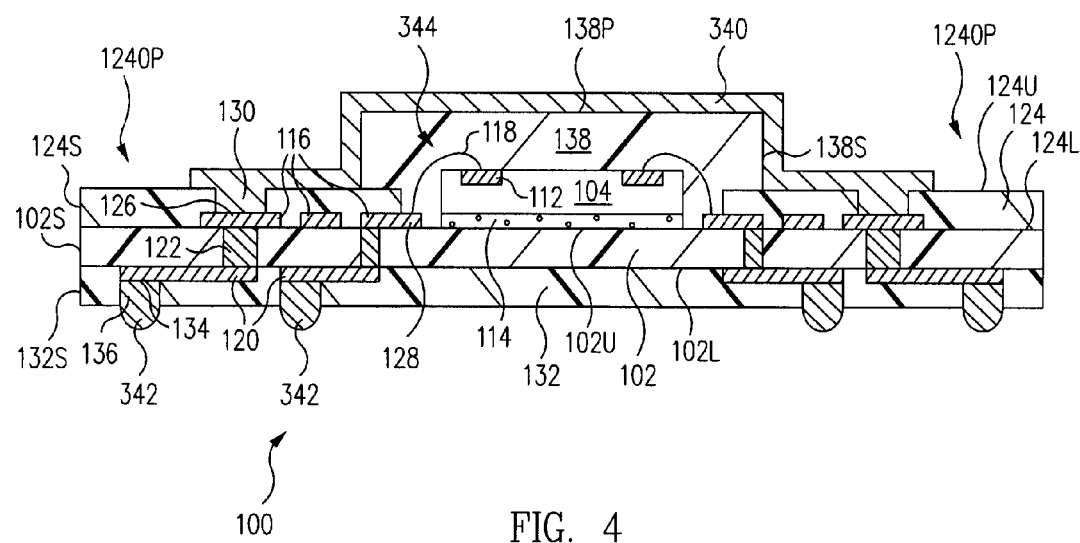
FIG. 4 is a cross-sectional view of the shielded electronic component package along the line IV-IV of FIG. 3 in accordance with one embodiment.

As an overview and in accordance with one embodiment, an electronic component package 100 as illustrated in FIGS. 3 and 4 for example includes a substrate 102 having an upper surface 102U, an electronic component 104 mounted to substrate 102, traces 116 on upper surface 102U, a terminal 126 on upper surface 102U, and a solder mask 124 on upper surface 102U. Solder mask 124 includes a solder mask opening 130 exposing terminal 126.

An electrically conductive coating 340 is formed on solder mask 124 and extends into solder mask opening 130 to contact and be electrically connected to terminal 126. Conductive coating 340 may be grounded to shield electronic component 104 from electromagnetic interference (EMI). Further, conductive coating 340 provides a ground plane for traces 116 facilitating impedance matching of signals on traces 116. In addition, conductive coating 340 has a high thermal conductivity thus enhancing heat dissipation from electronic component 104.

Figure 11:
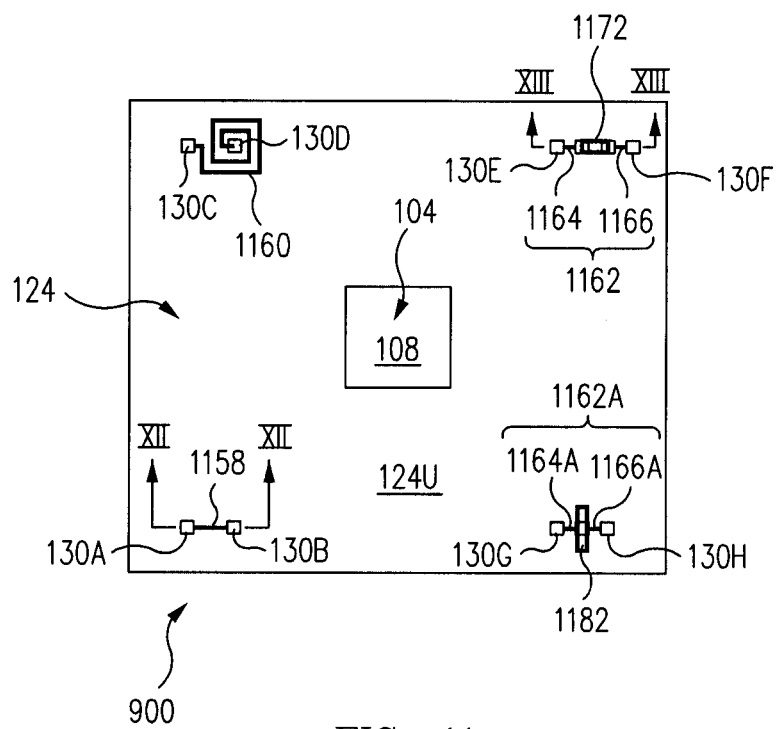
FIG. 11 is a top perspective view of the electronic component package of FIG. 9 at a later stage during fabrication in accordance with one embodiment.
Figure 12:
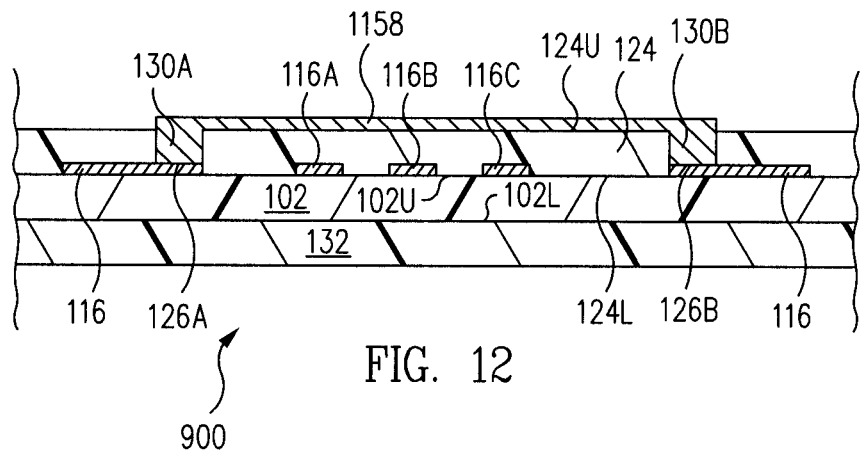
FIG. 12 is a cross-sectional view of the electronic component package along the line XII-XII of FIG. 11 in accordance with one embodiment.

In accordance with another embodiment, referring now to FIGS. 11 and 12 together for example, an electrically conductive feature 1158 formed on solder mask 124 can be used as a conductive path to transmit electrical signals. Although generalized overviews of various embodiments is provided above, other embodiments will be readily apparent to those of skill in the art in view of the following description.

Figure 1:
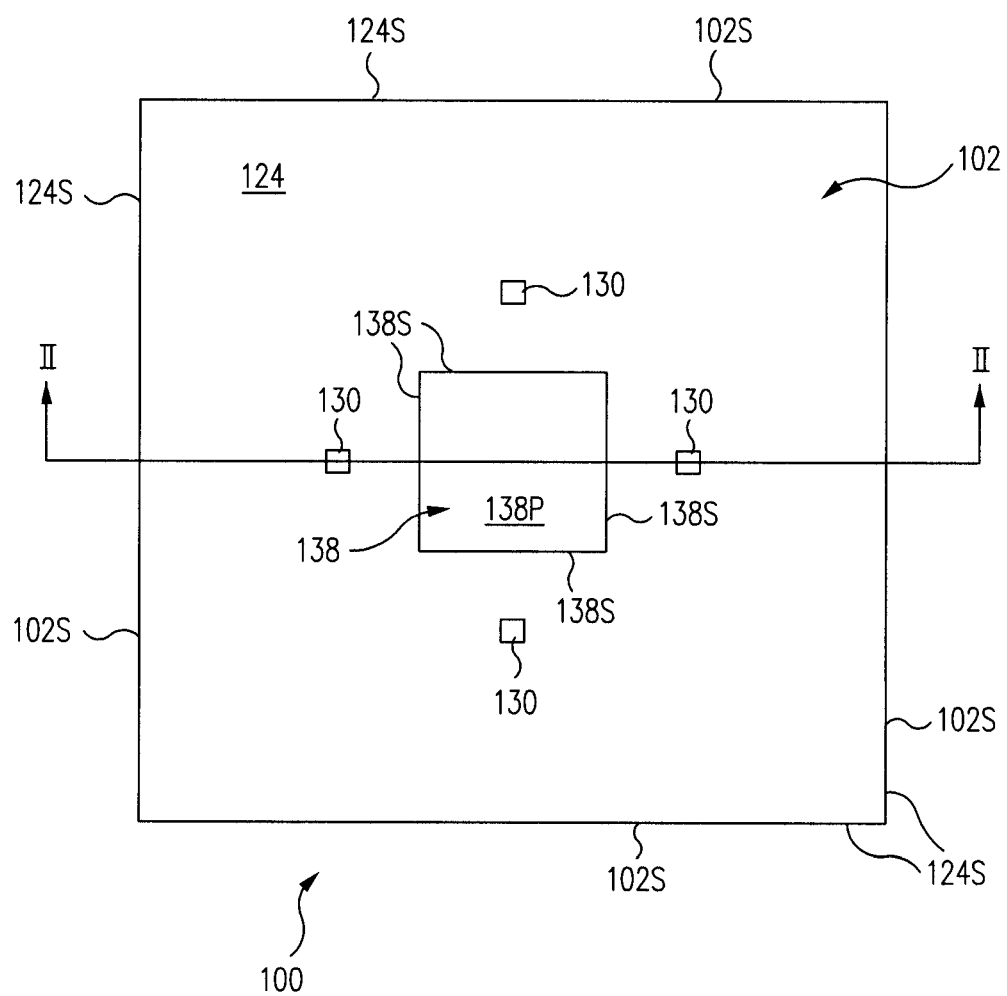
FIG. 1 is a top perspective view of a shielded electronic component package during fabrication in accordance with one embodiment.
Figure 2:
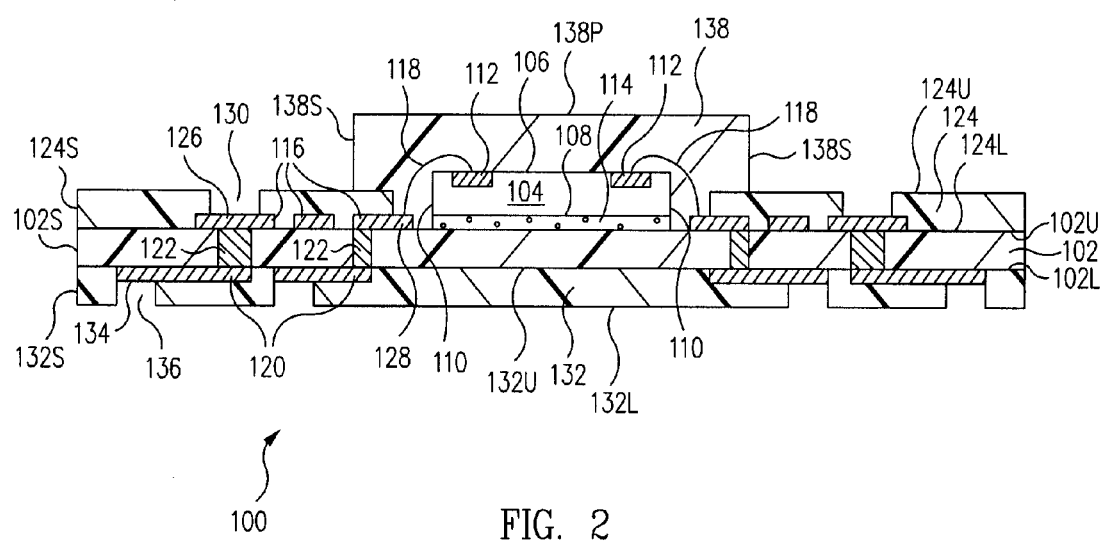
FIG. 2 is a cross-sectional view of the shielded electronic component package along the line II-II of FIG. 1 in accordance with one embodiment.

Now in more detail, FIG. 1 is a top perspective view of a shielded electronic component package 100 during fabrication in accordance with one embodiment. FIG. 2 is a cross-sectional view of shielded electronic component package 100 along the line II-II of FIG. 1 in accordance with one embodiment.

Referring now to FIGS. 1 and 2 together, shielded electronic component package 100, sometimes called an electronic component package, includes a substrate 102. Substrate 102 is a dielectric material such as laminate, ceramic, printed circuit board material, or other dielectric material.

Substrate 102 includes an upper, e.g., first, surface 102U and an opposite lower, e.g., second, surface 102L. Substrate 102 further includes sides 102S extending perpendicularly between upper surface 102U and lower surface 102L. Although the terms parallel, perpendicular, and similar terms are used herein, it is to be understood that the described features may not be exactly parallel and perpendicular, but only substantially parallel and perpendicular to within accepted manufacturing tolerances.

Further, although substrate 102 is set forth as including upper surface 102U, lower surface 102L and sides 102S, generally, substrate 102 can include multiple surfaces in addition to, or different than, upper surface 102U, lower surface 102L and sides 102S.

Shielded electronic component package 100 further includes an electronic component 104. In one embodiment, electronic component 104 is an integrated circuit chip, e.g., an active component. However, in other embodiments, electronic component 104 is a passive component such as a capacitor, resistor, or inductor. Further, in one embodiment, electronic component 104 includes two or more stacked dies.

In accordance with this embodiment, electronic component 104 is a single die and includes an active surface 106, an opposite inactive surface 108, and sides 110 extending perpendicularly between active surface 106 and inactive surface 108.

Electronic component 104 further includes bond pads 112 formed on active surface 106. Inactive surface 108 is mounted to upper surface 102U of substrate 102 with an adhesive 114.

Formed on upper surface 102U of substrate 102 are one or more electrically conductive upper, e.g., first, traces 116. Generally, upper traces 116 are formed of electrically conductive material such as, but not limited to, copper. One or more of bond pads 112 are electrically connected to one or more respective upper traces 116, e.g., bond fingers 128 thereof, by one or more respective electrically conductive bond wires 118. Upper traces 116 are sometimes called layer one (1) traces.

Formed on lower surface 102L of substrate 102 are lower, e.g., second, traces 120. Lower traces 120 are electrically connected to upper traces 116 by electrically conductive vias 122 extending through substrate 102 between upper surface 102U and lower surface 102L.

Although a particular electrically conductive pathway between bond pads 112 and lower traces 120 is described above, other electrically conductive pathways can be formed. For example, contact metallizations can be formed between the various electrical conductors.

Further, instead of straight though vias 122, in one embodiment, substrate 102 is a multilayer substrate and a plurality of vias and/or internal traces form the electrical interconnection between upper traces 116 and lower traces 120.

Shielded electronic component package 100 further includes a dielectric upper, e.g., first, solder mask 124 on upper surface 102U. Upper solder mask 124 includes an upper, e.g., first, surface 124U, a lower, e.g., second, surface 124L, and sides 124S extending perpendicularly between upper surface 124U and lower surface 124L.

Lower surface 124L is in direct contact with and is on upper surface 102U of substrate 102. Sides 124S are parallel to and coplanar with sides 102S of substrate 102 in accordance with this embodiment.

Upper solder mask 124 protects first portions of upper traces 116 while exposing second portions, e.g., terminals 126 and bond fingers 128, of upper traces 116. More particularly, upper solder mask 124 includes upper solder mask openings 130 that expose terminals 126 of upper traces 116. Upper solder mask openings 130 extend from upper surface 124U through upper solder mask 124 and to terminals 126 of upper traces 116.

Upper solder mask openings 130 are designed into upper solder mask 124 when upper solder mask 124 is applied. In another embodiment, upper solder mask 124 is applied, and then upper solder mask openings 130 are formed, e.g., using a selective etch or laser-ablation process. Upper solder mask openings 130 are sometimes called ground openings in solder mask 124. Although examples of the formation and location of upper solder mask openings 130 are set forth herein, in light of this disclosure, those of skill in the art will understand that the examples are illustrative only and that upper solder mask openings 130 can be formed using other techniques and at other locations in other examples.

Shielded electronic component package 100 further includes a dielectric lower, e.g., second, solder mask 132 on lower surface 102L. Lower solder mask 132 includes a lower, e.g., first, surface 132L, an upper, e.g., second, surface 132U, and sides 132S extending perpendicularly between upper surface 132U and lower surface 132L.

Upper surface 132U is in direct contact with and is on lower surface 102L of substrate 102. Sides 132S are parallel to and coplanar with sides 102S of substrate 102 in accordance with this embodiment.

Lower solder mask 132 protects first portions of lower traces 120 while exposing second portions, e.g., terminals 134, of lower traces 120. More particularly, lower solder mask 132 includes lower solder mask openings 136 that expose terminals 134 of lower traces 120. Lower solder mask openings 136 extend from lower surface 132L through lower solder mask 132 and to terminals 134 of lower traces 120.

In one embodiment, upper solder mask 124 and/or lower solder mask 132 provide a permanent protective coating for traces 116, 120, for example, to prevent short circuits. In various embodiments, upper solder mask 124 and/or lower solder mask 132 include: (1) an epoxy liquid; (2) a liquid photoimageable solder mask (LPSM) ink; (3) a photoresist; and/or (4) a dry film photoimageable solder mask (DFSM), although can be formed of other materials in other examples. Generally, upper solder mask 124 and lower solder mask 132 are formed of dielectric materials.

Shielded electronic component package 100 further includes a dielectric package body 138, e.g., formed of encapsulant or molding compound. Package body 138, sometimes called mold or a mold cap, encloses electronic component 104, bond wires 118, bond fingers 128, and a portion of upper solder mask 124 adjacent electronic component 104.

Package body 138 includes sides 138S and a principal surface 138P. Principal surface 138P is parallel to upper and lower surfaces 102U, 102L of substrate 102, and active and inactive surfaces 106, 108 of electronic component 104. Principal surface 138P is spaced above electronic component 104 and bond wires 118.

Sides 138S of package body 138 are located inwards of sides 102S of substrate 102. Sides 138S extend perpendicularly or angled between principal surface 138P and upper solder mask 124. In accordance with this embodiment, the outer periphery of upper solder mask 124 is exposed and not covered by package body 138. Further, upper solder mask openings 130 are outward of package body 138 and thus not covered by package body 138 and exposed.

Figure 2A:
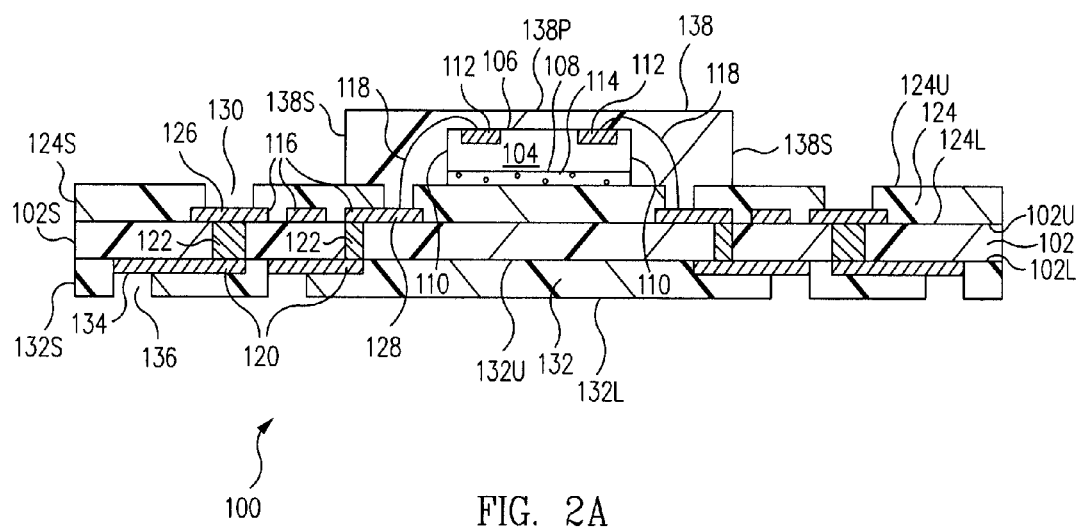
FIG. 2A is a cross-sectional view of the shielded electronic component package along the line II-II of FIG. 1 in accordance with another embodiment.

FIG. 2A is a cross-sectional view of shielded electronic component package 100 along the line II-II of FIG. 1 in accordance with another embodiment. Shielded electronic component package 100 of FIG. 2A is similar to shielded electronic component package 100 of FIG. 2 and only the significant differences are discussed below.

Figure 6:
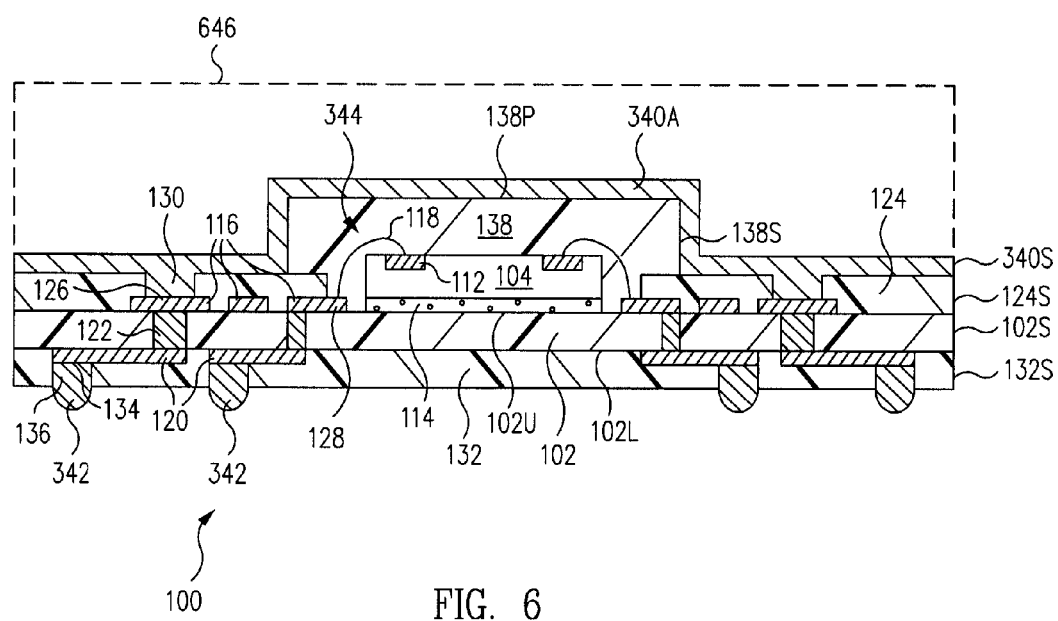
FIG. 6 is a cross-sectional view of the shielded electronic component package along the line VI-VI of FIG. 5 in accordance with one embodiment.

Referring now to FIG. 2A, in accordance with this embodiment, inactive surface 108 of electronic component 104 is mounted to upper surface 124U of upper solder mask 124 with adhesive 114. Although the following figures, e.g., FIGS. 4, 6, illustrate inactive surface 108 as being mounted to upper surface 102U of substrate 102 with adhesive 114, in light of this disclosure, those of skill in the art will understand that inactive surface 108 of electronic component 104 can also be mounted to upper surface 124U of upper solder mask 124 with adhesive 114 in a manner similar to that illustrated in FIG. 2A.

FIG. 3 is a top perspective view of shielded electronic component package 100 of FIG. 1 at a later stage during fabrication in accordance with one embodiment. FIG. 4 is a cross-sectional view of shielded electronic component package 100 along the line IV-IV of FIG. 3 in accordance with one embodiment.

Referring now to FIGS. 3 and 4 together, an electrically conductive shield layer 340 is formed. Conductive shield layer 340, sometimes called a conductive conformal coating, directly contacts and encloses package body 138 including principal surface 138P and sides 138S and the inner portion of upper surface 124U of upper solder mask 124. Further, conductive shield layer 340 fills upper solder mask openings 130 and thus directly contacts and is electrically connected to terminals 126 of upper traces 116.

In one embodiment, to form conductive shield layer 340, an electrically conductive material is selectively applied to package body 138, the inner portion of upper solder mask 124, and upper solder mask openings 130. Illustratively, an electrically conductive coating, e.g., electrically conductive paint such as a urethane base silver paint, is selectively sprayed, silk screened, or applied using another method and cured, e.g., dried, to form conductive shield layer 340.

In another embodiment, an electrically conductive coating is non-selectively applied to package body 138, the entire upper surface 124U of upper solder mask 124, and upper solder mask openings 130. The electrically conductive coating is patterned, e.g., is removed from an outer periphery 124OP of upper solder mask 124 using laser-ablation, to form conductive shield layer 340.

Although various examples are provided above regarding the formation and material of conductive shield layer 340, in light of this disclosure, those of skill in the art will understand that the examples are illustrative only and that conductive shield layer 340 can be formed using other techniques and other materials in other examples.

As set forth above, conductive shield layer 340 is electrically connected to terminals 126 of upper traces 116. In one embodiment, terminals 126 and thus conductive shield layer 340 are electrically connected to a reference voltage, e.g., ground. For example, interconnection balls 342, e.g., solder balls, are formed on terminals 134 of lower traces 120. One or more of interconnection balls 342 are electrically connected to a reference voltage, e.g., ground, thus grounding conductive shield layer 340.

In one embodiment, lower interconnection balls 342 are not formed. For example, lower interconnection balls 342 are not formed and terminals 134 are distributed in an array forming a land grid array (LGA).

Accordingly, conductive shield layer 340 defines a shielded compartment 344 in which electronic component 104 is located. By locating electronic component 104 within shielded compartment 344, electronic component 104 is shielded from electromagnetic radiation, also referred to herein as electromagnetic interference (EMI) or radio frequency interference (RFI).

Further, conductive shield layer 340 provides a ground plane on top of upper traces 116, i.e., only separated by upper solder mask 124. This facilitates impedance matching of signals on upper traces 116. Further, this allows stripline routing of upper traces 116. In another embodiment, for a given impedance, the width of upper traces 116 can be reduced when conductive shield layer 340 is provided allowing more robust routing of upper traces 116.

In accordance with one embodiment, conductive shield layer 340 has a relatively high thermal conductivity. Accordingly, heat generated by electronic component 104 is transferred to conductive shield layer 340 and dissipated to the ambient environment. Conductive shield layer 340 is sometimes called a heat slug in accordance with this embodiment. In one embodiment, the thickness of conductive shield layer 340 is set to obtain a desired heat dissipation from electronic component 104, e.g., the thickness is increased to increase heat dissipation.

As set forth above, conductive shield layer 340 covers the inner portion of upper solder mask 124. Accordingly, outer periphery 124OP of upper solder mask 124 is not covered by conductive shield layer 340 and exposed. However, as discussed below in reference to FIGS. 5 and 6, in another embodiment, conductive shield layer 340 extends entirely outwards and terminates at the end of solder mask 124U. In another embodiment, conductive shield layer 340 extends entirely outward and to sides 124S of upper solder mask 124 and thus covers outer periphery 124OP of upper solder mask 124.

Figure 5:
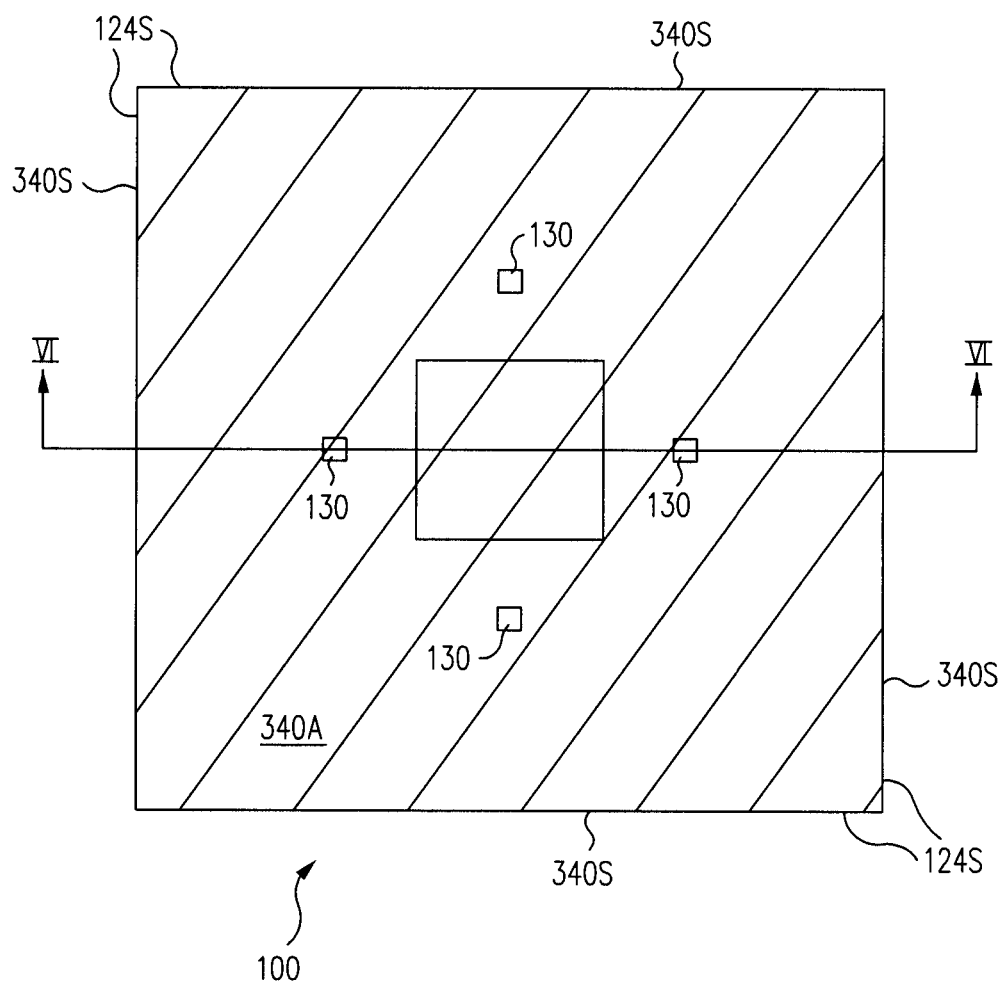
FIG. 5 is a top perspective view of the shielded electronic component package of FIG. 1 at a later stage during fabrication in accordance with another embodiment.

FIG. 5 is a top perspective view of shielded electronic component package 100 of FIG. 1 at a later stage during fabrication in accordance with another embodiment. FIG. 6 is a cross-sectional view of shielded electronic component package 100 along the line VI-VI of FIG. 5 in accordance with one embodiment. Shielded electronic component package 100 of FIGS. 5 and 6 is similar to shielded electronic component package 100 of FIGS. 3 and 4 and only the significant differences are discussed below.

In accordance with this embodiment, shielded electronic component package 100 includes a conductive shield layer 340A. Conductive shield layer 340A is similar to conductive shield layer 340 as discussed above in reference to FIGS. 3 and 4 and only the significant differences are discussed below. More particularly, conductive shield layer 340A covers the entire exposed upper surface 124U of upper solder mask 124 and extends to sides 124S of upper solder mask 124. Sides 340S of conductive shield layer 340A are parallel to and coplanar with sides 124S of upper solder mask 124. Accordingly, the entire upper surface of shielded electronic component package 100 is covered by and shielded with conductive shield layer 340A.

As indicated by the dashed line in FIG. 6, optionally, in one embodiment, shielded electronic component package 100 further includes a lid 646. Lid 646 is mounted to conductive shield layer 340A, e.g., at the outer periphery thereof.

In one embodiment, lid 646 is an electrically conductive material, e.g., a metal, that is electrically connected to conductive shield layer 340A, e.g., with an electrically conductive adhesive. In accordance with one embodiment, lid 646 is a grounded lid that provides additional shielding for shielded electronic component package 100.

In another embodiment, lid 646 is a heat sink formed of a material that has a high thermal conductivity. Illustratively, lid 646 is a metal, e.g., copper, although is formed of other high thermal conductivity materials in other embodiments. Lid 646 is thermally connected to conductive shield layer 340, e.g., with a thermally conductive adhesive.

In accordance with this embodiment, conductive shield layer 340A has a relatively high thermal conductivity. Accordingly, heat generated by electronic component 104 is transferred to conductive shield layer 340A, to lid 646, and dissipated to the ambient environment.

Figure 7:
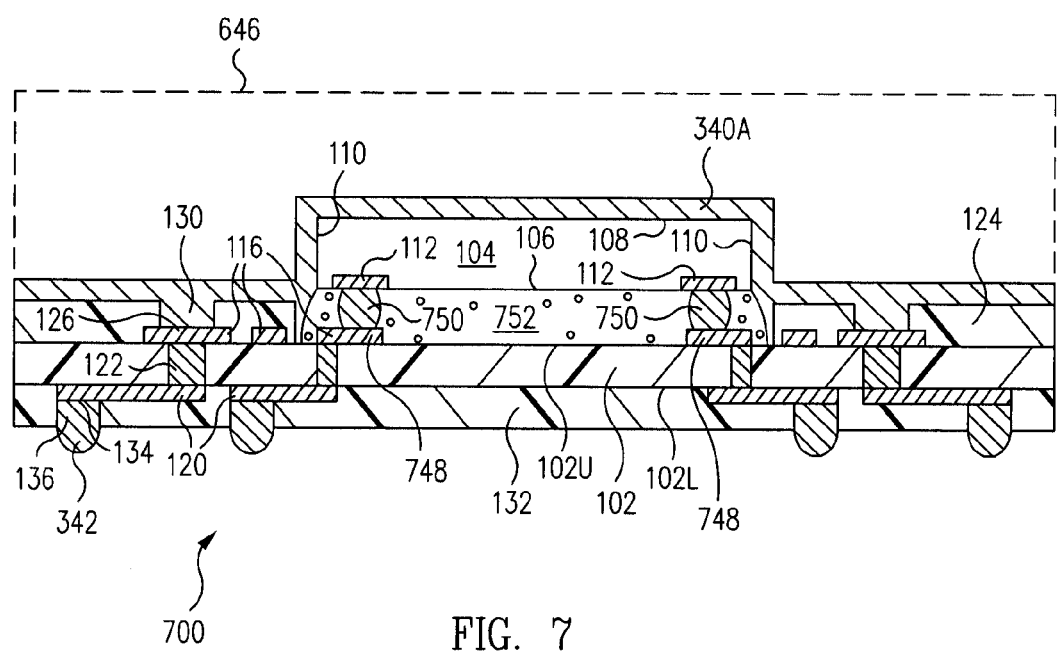
FIG. 7 is a cross-sectional view of a shielded electronic component package in accordance with another embodiment.

FIG. 7 is a cross-sectional view of a shielded electronic component package 700 in accordance with another embodiment. Shielded electronic component package 700 of FIG. 7 is similar to shielded electronic component package 100 of FIG. 6 and only the significant differences are discussed below. More particularly, electronic component 104 is mounted in a flip chip configuration in shielded electronic component package 700 of FIG. 7 and is mounted in a wirebond configuration in shielded electronic component package 100 of FIG. 6.

Referring now to FIG. 7, bond pads 112 of electronic component 104 are mounted to upper traces 116, e.g., flip chip terminals 748 thereof, by flip chip bumps 750, e.g., solder bumps or other electrically conductive material. An underfill 752 encloses flip chip bumps 750 and fills the space between active surface 106 of electronic component 104 and upper surface 102U of substrate 102.

In accordance with this embodiment, conductive shield layer 340A encloses electronic component 104 including inactive surface 108 and sides 110. Conductive shield layer 340A further encloses underfill 752.

To fabricate shielded electronic component package 700, electronic component 104 is flip chip mounted to upper traces 116, e.g., flip chip terminals 748 thereof, by flip chip bumps 750. Underfill 752 is applied to enclose flip chip bumps 750 and to fill the space between active surface 106 of electronic component 104 and upper surface 102U of substrate 102. Conductive shield layer 340A is then applied. Accordingly, conductive shield layer 340A is applied after flip chip mounting of electronic component 104.

Figure 7A:
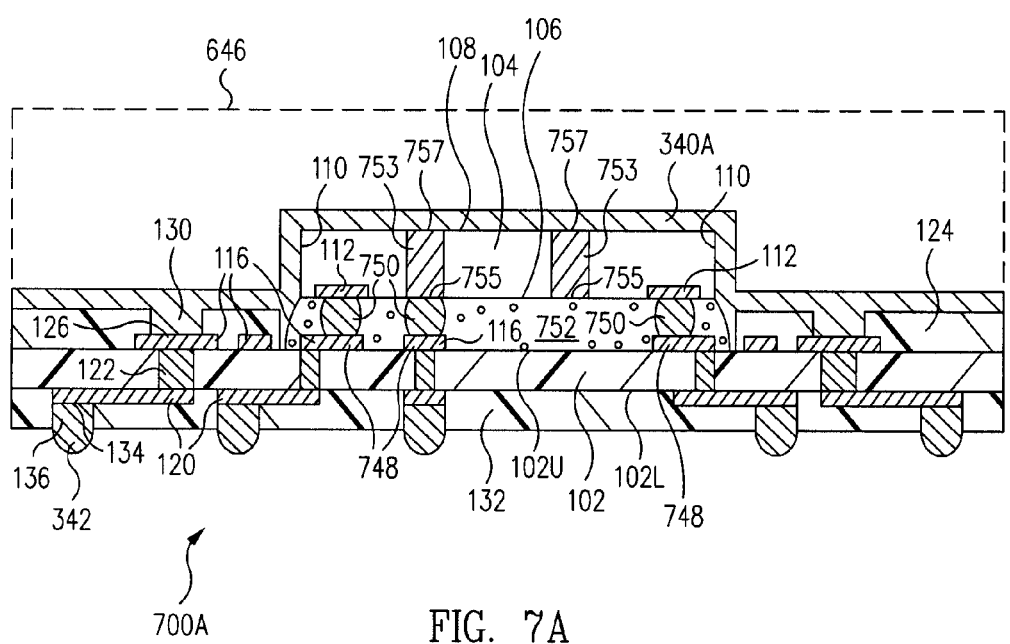
FIG. 7A is a cross-sectional view of a shielded electronic component package in accordance with another embodiment.

FIG. 7A is a cross-sectional view of a shielded electronic component package 700A in accordance with another embodiment. Shielded electronic component package 700A of FIG. 7A is similar to shielded electronic component package 700 of FIG. 7 and only the significant differences are discussed below.

Referring now to FIG. 7A, in accordance with this embodiment, electronic component 104 includes at least one electrically conductive via 753, e.g., formed of copper or other electrically conductive material, extending through electronic component 104 between active surface 106 and inactive surface 108. The ends of vias 753 at active surface 106 define active surface via terminals 755 of vias 753. Similarly, the ends of vias 753 at inactive surface 108 define inactive surface via terminals 757 of vias 753.

Inactive surface via terminals 757 of vias 753 are in direct contact with and electrically connected to conductive shield layer 340A. As illustrated by the via 753 at the left, in one embodiment, one or more of active surface via terminals 755 of vias 753 are mounted and electrically connected to upper traces 116, e.g., flip chip terminals 748 thereof, by flip chip bumps 750. Accordingly, a reference voltage, e.g., ground, can be provided to a respective active surface via terminal 755. The reference voltage is coupled through the respective via 753 and to conductive shield layer 340A.

Further, as illustrated by the via 753 at the right, in another embodiment, one or more of active surface via terminals 755 of vias 753 remain unconnected to a flip chip bump 750. For example, a reference voltage, e.g., ground, is provided from conductive shield layer 340A and to an inactive surface via terminal 757. The reference voltage is coupled through the respective via 753 and to the respective active surface via terminal 755 and generally to active surface 106.

Accordingly, in one embodiment, vias 753 enable a reference voltage to be provided from active surface 106 through electronic component 104 and to conductive shield layer 340A. In another embodiment, vias 753 enable a reference voltage to be provided from conductive shield layer 340A (inactive surface 108) through electronic component 104 and to active surface 106. Although examples of electrical functions of vias 753 are provided above, in other embodiments, vias 753 serve other/additional electrical functions or simply function to enhance heat removal from electronic component 104 as discussed further below.

In another embodiment, vias 753 are formed of a thermally conductive material, e.g., copper or other thermally conductive material, having a higher heat transfer coefficient than the bulk of electronic component 104, e.g., silicon. As set forth above, inactive surface via terminals 757 of vias 753 are in direct contact with conductive shield layer 340A. Thus, vias 753 are thermally connected to conductive shield layer 340A.

Accordingly, heat generated by electronic component 104 is transferred to vias 753, to conductive shield layer 340A, and dissipated to the ambient environment. Thus, use of vias 753 provides maximum electrical and thermal performance of shielded electronic component package 700A in accordance with various embodiments.

Figure 8:
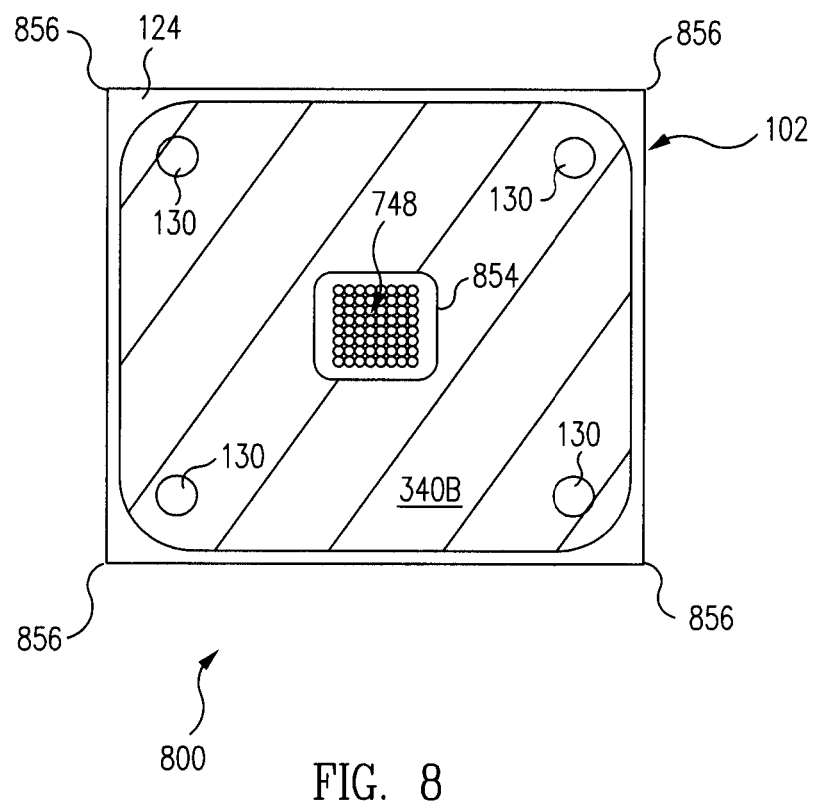
FIG. 8 is a top perspective view of a shielded electronic component package during fabrication in accordance with another embodiment.

FIG. 8 is a top perspective view of a shielded electronic component package 800 during fabrication in accordance with another embodiment. In accordance with this embodiment, a conductive shield layer 340B has been applied to upper solder mask 124, and generally to substrate 102, prior to mounting of electronic component 104. More particularly, conductive shield layer 340B includes a die attach area opening 854 through which flip chip terminals 748 are exposed. Further, in accordance with this embodiment, upper solder mask openings 130 are located adjacent corners 856 of substrate 102. Although four upper solder mask openings 130 are illustrated, in light of this disclosure, those of skill in the art will understand that more or less than four upper solder mask openings 130 are formed in other embodiments. Generally, die attach area opening 854 is an exposed area where electronic component 104 is later mounted.

Figure 9:
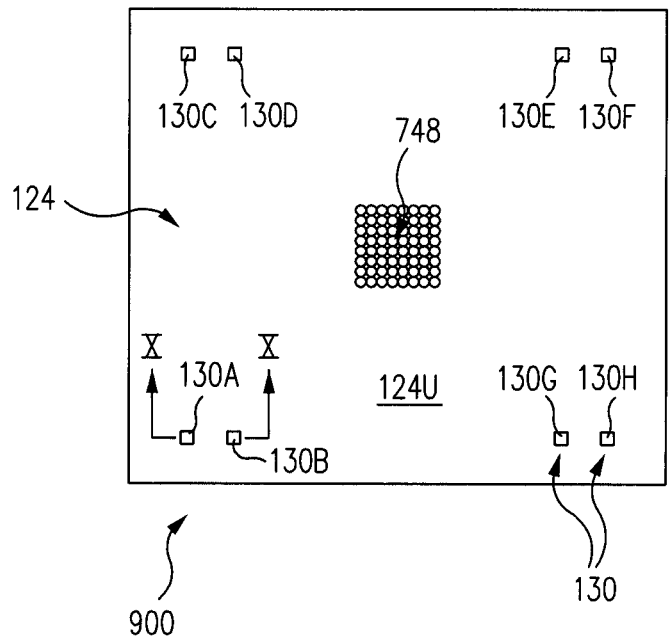
FIG. 9 is a top perspective view of an electronic component package during fabrication in accordance with another embodiment.
Figure 10:
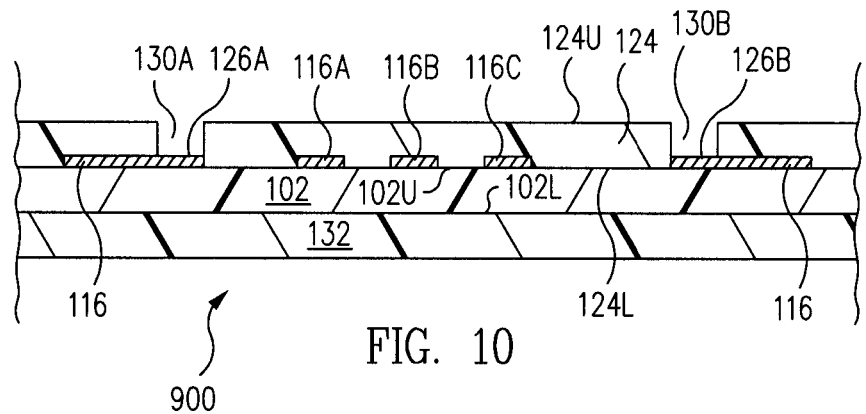
FIG. 10 is a cross-sectional view of the electronic component package along the line X-X of FIG. 9 in accordance with one embodiment.

FIG. 9 is a top perspective view of an electronic component package 900 during fabrication in accordance with another embodiment. FIG. 10 is a cross-sectional view of electronic component package 900 along the line X-X of FIG. 9 in accordance with one embodiment. Electronic component package 900 of FIGS. 9 and 10 is similar to shielded electronic component package 100 of FIGS. 1 and 2 and only the significant differences are discussed below.

Referring to FIGS. 9 and 10 together, upper solder mask 124 includes upper solder mask openings 130 that expose terminals 126 of upper traces 116. Upper solder mask openings 130 includes upper solder mask openings 130A, 130B, 130C, 130D, 130E, 130F, 130G, 130H. Although eight upper solder mask openings 130 are illustrated, in light of this disclosure, those of skill in the art will understand that more or less than eight upper solder mask openings 130 can be formed depending upon the particular circuit patterns to be formed on upper solder mask 124.

As illustrated in FIG. 10, one or more upper traces 116, e.g., three upper traces 116A, 116B, 116C as illustrated in FIG. 10, are located between upper solder mask openings 130A, 130B. Upper traces 116A, 116B, 116C are covered by upper solder mask 124 between upper solder mask openings 130A, 130B. More particularly, upper solder mask 124 exist between upper surface 124U of upper solder mask 124 and upper traces 116A, 116B, 116C. Upper solder mask openings 130A, 130B expose terminals 126A, 126B of terminals 126.

Figure 13:
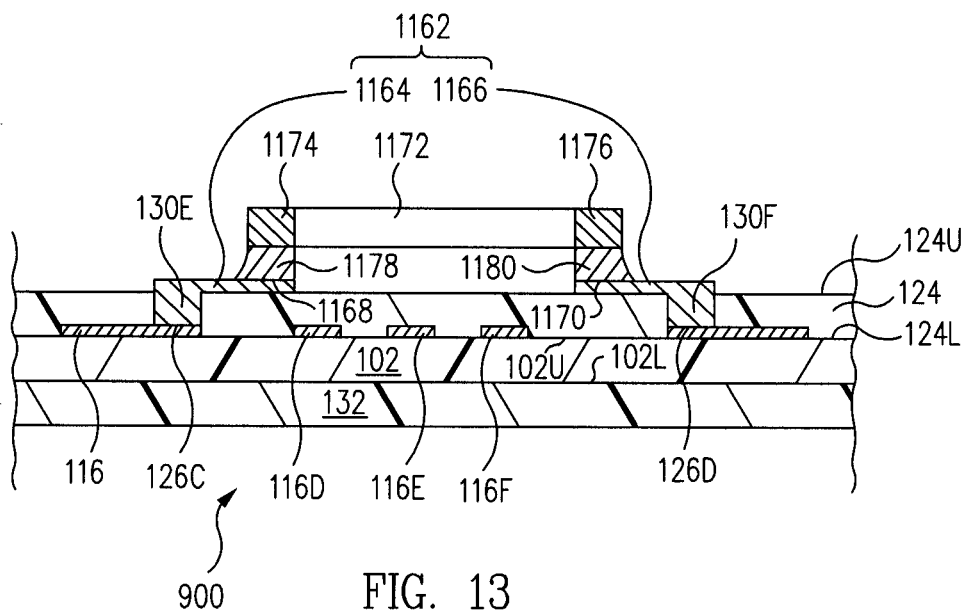
FIG. 13 is a cross-sectional view of the electronic component package along the line XIII-XIII of FIG. 11 in accordance with one embodiment.

FIG. 11 is a top perspective view of electronic component package 900 of FIG. 9 at a later stage during fabrication in accordance with one embodiment. FIG. 12 is a cross-sectional view of electronic component package 900 along the line XII-XII of FIG. 11 in accordance with one embodiment. FIG. 13 is a cross-sectional view of electronic component package 900 along the line XIII-XIII of FIG. 11 in accordance with one embodiment.

Referring to FIGS. 11 and 12 together, an electrically conductive coating feature 1158 has been formed using an electrically conductive coating to electrically connect terminals 126A, 126B. Electrically conductive coating feature 1158 extends into upper solder mask openings 130A, 130B to contact and be electrically connected to terminals 126A, 126B. Further, electrically conductive coating feature 1158 extends on upper surface 124U of upper solder mask 124 between upper solder mask openings 130A, 130B. The portion of an electrically conductive coating within a solder mask opening is sometimes called an electrically conductive coating via.

As illustrated in FIG. 12, electrically conductive coating feature 1158 is directly above upper traces 116A, 116B, 116C. Upper solder mask 124 is located between and electrically isolates electrically conductive coating feature 1158 from upper traces 116A, 116B, 116C. Accordingly, electrically conductive coating feature 1158 electrically connects terminals 126A, 126B above upper traces 116A, 116B, 116C. Electrically conductive coating feature 1158 is sometimes called an electrically conductive coating trace, i.e., an electrically conductive trace on upper solder mask 124.

In one embodiment, to form electrically conductive coating feature 1158, an electrically conductive material is selectively applied to upper solder mask 124 including upper solder mask openings 130A, 130B. Illustratively, an electrically conductive coating, e.g., electrically conductive paint such as a urethane base silver paint, is selectively sprayed, silk screened or applied using another method and cured, e.g., dried, to form electrically conductive coating feature 1158. In another embodiment, an electrically conductive coating is non-selectively applied to upper solder mask 124 including upper solder mask openings 130A, 130B and patterned, e.g., using laser-ablation, to form electrically conductive coating feature 1158.

Although electrically conductive coating feature 1158 is illustrated as a straight line segment, in other embodiments, electrically conductive coating feature 1158 is patterned into any one of a number of circuit patterns or devices. By providing another layer of circuit patterns (traces) on upper solder mask 124, the flexibility in routing of traces in electronic component package 900 is maximized. Further, by providing another layer of circuit patterns (traces) on upper solder mask 124, essentially another metal layer is added to substrate 102.

To illustrate, referring to FIG. 11, an electrically conductive coating feature 1160 similar to electrically conductive coating feature 1158 electrically connects terminals 126 exposed through solder mask openings 130C, 130D.

Electrically conductive coating feature 1160 is patterned into a conductive inductor, e.g., is a rectangular spiral. More particularly, electrically conductive coating feature 1160 is a progressively increasing rectangle on the plane of upper surface 124U of upper solder mask 124 that winds around upper solder mask opening 130D at a continuously increasing distance from upper solder mask opening 130D. Electrically conductive coating feature 1160 is an example of an embedded component on top of upper solder mask 124.

To further illustrate, referring to FIGS. 11 and 13 together, an electrically conductive coating feature 1162 similar to electrically conductive coating feature 1158 is electrically connected to terminals 126 exposed through solder mask openings 130E, 130F. More particularly, electrically conductive coating feature 1162 includes a first trace 1164 and a second trace 1166.

First trace 1164 extends into upper solder mask opening 130E to contact and be electrically connected to a terminal 126C of terminals 126. First trace 1164 extends along upper surface 124U of upper solder mask 124 and terminates at a first surface mount component terminal 1168.

Similarly, second trace 1166 extends into upper solder mask opening 130F to contact and be electrically connected to a terminal 126D of terminals 126. Second trace 1166 extends along upper surface 124U of upper solder mask 124 and terminates at a second surface mount component terminal 1170.

Surface mount component terminals 1168, 1170 are on upper surface 124U of upper solder mask 124. A surface mounted component 1172, e.g., a passive component such as a capacitor, inductor, or resistor, is surface mounted to surface mount component terminals 1168, 1170, although other types of devices are mounted in other embodiments. More particularly, terminals 1174, 1176 of surface mounted component 1172 are mounted to surface mount component terminals 1168, 1170 by solder joints 1178, 1180, respectively. Surface mounted component 1172 is sometimes called a SMT component.

As illustrated in FIG. 13, surface mounted component 1172 is directly above upper traces 116D, 116E, 116F. Upper solder mask 124 is located between and electrically isolates surface mounted component 1172 from upper traces 116D, 116E, 116F. Accordingly, surface mounted component 1172 is mounted directly above upper traces 116D, 116E, 116F of traces 116 and on top of upper solder mask 124.

To further illustrate, referring to FIG. 11 again, an electrically conductive coating feature 1162A similar to electrically conductive coating feature 1162 is electrically connected to terminals 126 exposed through solder mask openings 130G, 130H. More particularly, electrically conductive coating feature 1162A includes a first trace 1164A and a second trace 1166A. First trace 1164A and second trace 1166A are electrically connected to terminals of a resistor 1182, e.g., a thick film resistor, sometimes called an embedded device, formed on upper surface 124U of upper solder mask 124.

As set forth above, electrically conductive coating features 1158, 1160, 1162, 1162A are formed on upper solder mask 124 and electrically connected to upper traces 116, e.g., to signals on layer one (1) traces of electronic component package 900. Essentially, electrically conductive coating features 1158, 1160, 1162, 1162A provide another metal layer of substrate 102.

Referring again to FIGS. 9 and 11 together, electronic component 104 is flip chip mounted to flip chip terminals 748 of upper traces 116.

Figure 14:
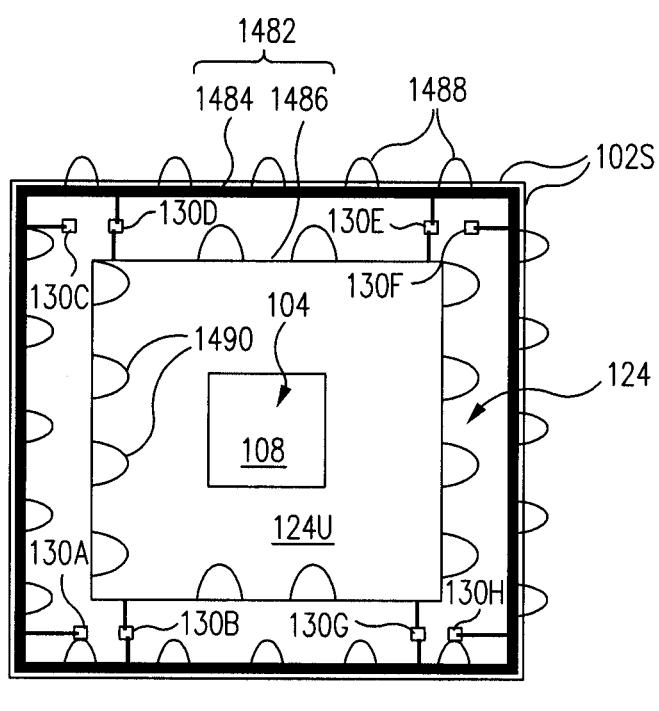
FIG. 14 is a top perspective view of a shielded electronic component package during fabrication in accordance with another embodiment.
Figure 15:
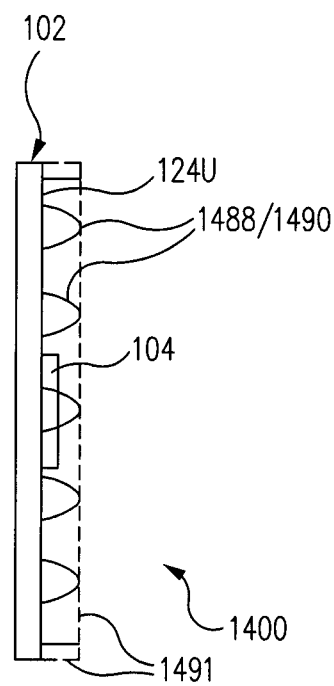
FIG. 15 is a side perspective view of the shielded electronic component package of FIG. 14 in accordance with one embodiment.

FIG. 14 is a top perspective view of a shielded electronic component package 1400 during fabrication in accordance with another embodiment. FIG. 15 is a side perspective view of shielded electronic component package 1400 of FIG. 14 in accordance with one embodiment. Shielded electronic component package 1400 of FIGS. 14 and 15 is similar to electronic component package 900 of FIG. 11 and only the significant differences are discussed below.

In accordance with this embodiment, an electrically conductive coating feature 1482 is formed on upper surface 124U of upper solder mask 124. Conductive coating feature 1482 extends into upper solder mask openings 130 including one or more solder mask openings 130A, 130B, 130C, 130D, 130E, 130F, 130G, 130H, and is electrically connected to terminals 126 of upper traces 116 exposed through upper solder mask openings 130. In one embodiment, conductive coating feature 1482 is electrically connected to a reference voltage source, e.g., ground.

In accordance with this embodiment, conductive coating feature 1482 includes an outer rectangular wire fence trace 1484 and an inner rectangular wire fence trace 1486. Outer rectangular wire fence trace 1484 is formed on upper surface 124U of upper solder mask 124 directly adjacent sides 102S of substrate 102.

Inner rectangular wire fence trace 1486 is formed inward of outer rectangular wire fence trace 1484. More particularly, inner rectangular wire fence trace 1486 is formed on upper surface 124U of upper solder mask 124 between outer rectangular wire fence trace 1484 and electronic component 104.

As set forth above, conductive coating feature 1482 is formed on upper solder mask 124 on which there are no space constraints, i.e., there are no conductors or other electrically conductive features around which conductive coating feature 1482 must be placed. Accordingly, multiple rectangular wire fence traces, e.g., wire fence traces 1484, 1486, (and associated wire fences as discussed below) are readily accommodated.

An outer wire fence 1488 is formed on outer rectangular wire fence trace 1484. Similarly, an inner wire fence 1490 is formed on inner rectangular wire fence trace 1486. Outer and inner wire fences 1488, 1490 are fences formed from electrically conductive wire. Outer and inner wire fences 1488, 1490 protrude upwards, e.g., with wire loops, from outer and inner rectangular wire fence traces 1484, 1486. For example, outer and inner wire fences 1488, 1490 are formed using methods similar to those set forth in Scanlan et al., U.S. patent application Ser. No. 11/754,209, entitled "A SEMICONDUCTOR DEVICE HAVING EMI SHIELDING AND METHOD THEREFOR", filed on May 25, 2007, which is herein incorporated by reference in its entirety.

As set forth above, in one embodiment, conductive coating feature 1482 is electrically connected to a reference voltage source, e.g., ground. As outer and inner wire fences 1488, 1490 are formed on and electrically connected to conductive coating feature 1482, outer and inner wire fences 1488, 1490 are also grounded. Accordingly, outer and inner wire fences 1488, 1490 form an EMI shield around electronic component 104. In one embodiment, use of outer and inner wire fences 1488, 1490 eliminate the need to form a conductive shield at the side of shielded electronic component package 1400.

As illustrated in FIG. 15 by the dashed lines, in one embodiment, outer and inner wire fences 1488, 1490 are enclosed within a package body 1491, e.g., an encapsulant or mold compound.

Although two rectangular wire fence traces 1484, 1486 including two wire fences 1488, 1490 are illustrated and discussed in reference to shielded electronic component package 1400, in other embodiments, only a single wire fence trace, or more than two wire fence traces and associated wire fences are formed.

Figure 16:
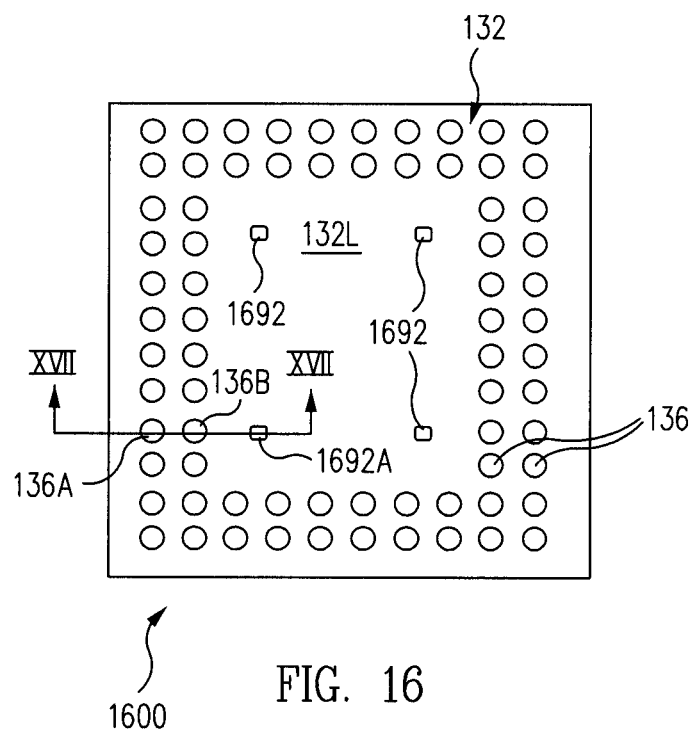
FIG. 16 is a bottom perspective view of a shielded electronic component package during fabrication in accordance with one embodiment.
Figure 17:
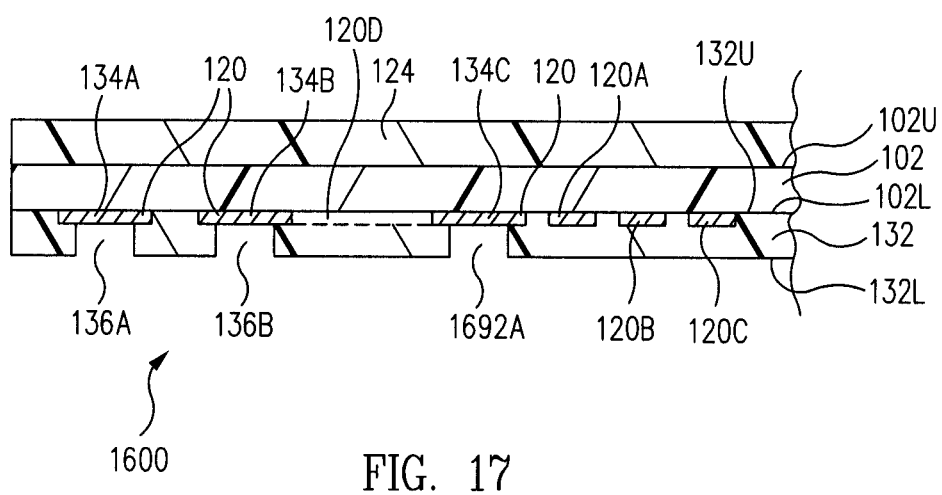
FIG. 17 is a cross-sectional view of the shielded electronic component package along the line XVII-XVII of FIG. 16 in accordance with one embodiment.

FIG. 16 is a bottom perspective view of a shielded electronic component package 1600 during fabrication in accordance with one embodiment. FIG. 17 is a cross-sectional view of shielded electronic component package 1600 along the line XVII-XVII of FIG. 16 in accordance with one embodiment.

Referring now to FIGS. 16 and 17 together, lower solder mask 132 includes lower solder mask openings 136 and one or more lower solder mask openings 1692, e.g., four lower solder mask openings 1692. Although four lower solder mask openings 1692 are illustrated at particular locations, in light of this disclosure, those of skill in the art will understand that more or less solder mask openings 1692 can be formed at other/additional locations in other embodiments.

Lower solder mask openings 136 include lower solder mask openings 136A, 136B exposing terminals 134A, 134B of terminals 134 of lower traces 120. In one embodiment, terminals 134A, 134B define ball grid array (BGA) lands to which interconnection balls, sometimes called solderballs, are connected as discussed further below. Lower solder mask openings 136 are sometimes called solder ball solder mask openings. In another embodiment, terminals 134 are distributed in an array thus forming a land grid array (LGA) and interconnection balls are not formed on terminals 134.

Lower solder mask openings 1692 include a lower solder mask opening 1692A exposing a terminal 134C of terminals 134 of lower traces 120. In one embodiment, terminal 134C defines a conductive shield layer land as also discussed further below. Lower solder mask openings 1692 are sometimes called ground solder mask openings.

In this particular embodiment, lower solder mask openings 136 are arranged as an array adjacent sides 102S of substrate 102. Lower solder mask openings 1692 are arranged inwards of lower solder mask openings 136.

As further illustrated in FIG. 17, one or more of lower traces 120, e.g., lower traces 120A, 120B, 120C of lower traces 120, are covered by and enclosed within lower solder mask 132. More particularly, lower solder mask 132 exist between lower surface 132L of lower solder mask 132 and lower traces 120A, 120B, 120C.

Optionally, as indicated by the dashed line in FIG. 17, in one embodiment, terminal 134B is electrically connected to terminal 134C by a lower trace 120D. Lower trace 120D is covered by and enclosed within lower solder mask 132. More particularly, lower solder mask 132 exist between lower surface 132L of lower solder mask 132 and lower trace 120D.

Figure 18:
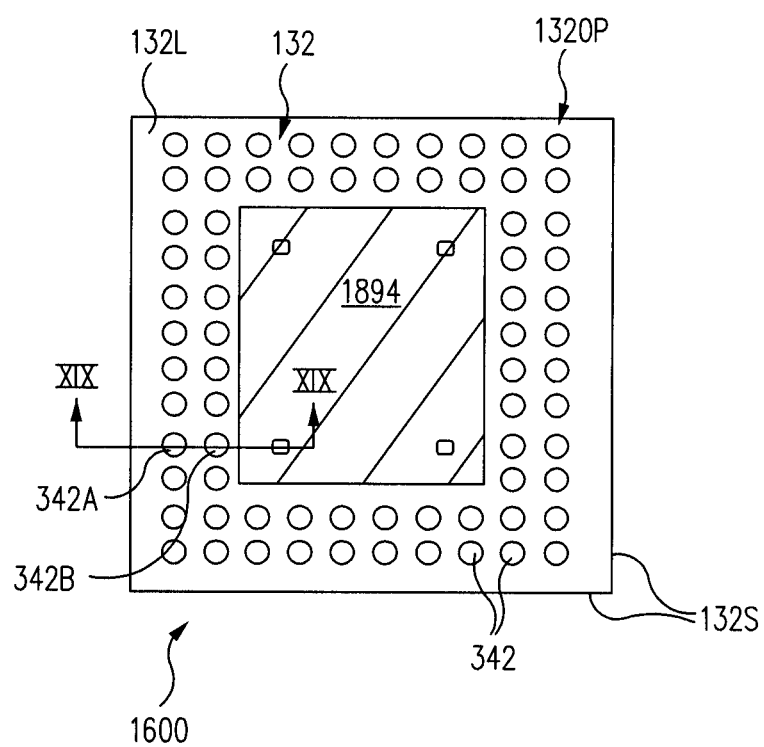
FIG. 18 is a bottom perspective view of the shielded electronic component package of FIG. 16 at a later stage during fabrication in accordance with one embodiment.
Figure 19:
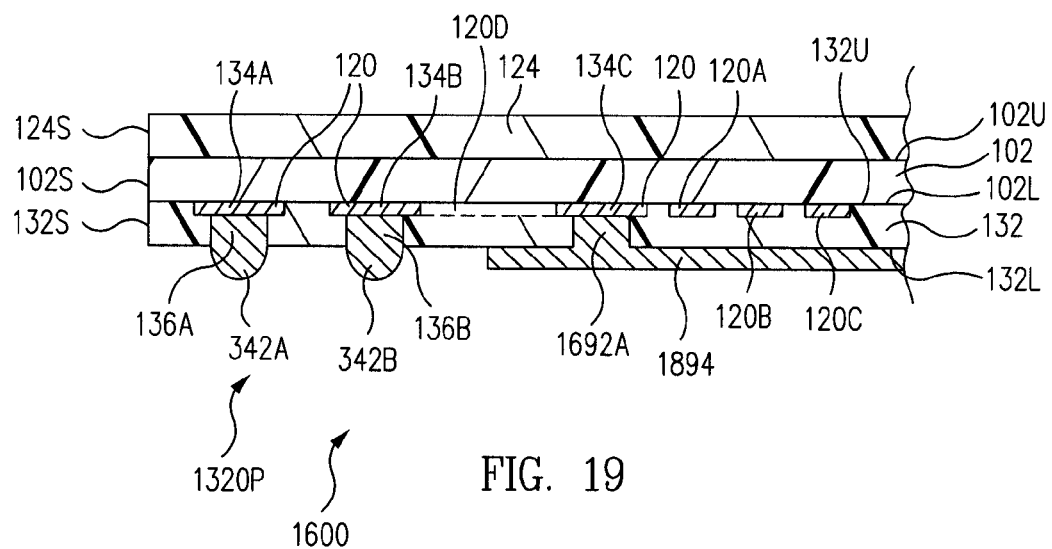
FIG. 19 is a cross-sectional view of the shielded electronic component package along the line XIX-XIX of FIG. 18 in accordance with one embodiment.

FIG. 18 is a bottom perspective view of shielded electronic component package 1600 of FIG. 16 at a later stage during fabrication in accordance with one embodiment. FIG. 19 is a cross-sectional view of shielded electronic component package 1600 along the line XIX-XIX of FIG. 18 in accordance with one embodiment.

Referring now to FIGS. 18 and 19 together, an electrically conductive shield layer 1894 is formed. Conductive shield layer 1894 directly contacts and encloses the inner portion of lower surface 132L of lower solder mask 132. Further, conductive shield layer 1894 fills lower solder mask openings 1692 and thus directly contacts and is electrically connected to the respective terminals 134 of upper traces 116 including terminal 134C.

In one embodiment, to form conductive shield layer 1894, an electrically conductive material is selectively applied to the inner portion of lower solder mask 132, and lower solder mask openings 1692. Illustratively, an electrically conductive coating, e.g., electrically conductive paint such as a urethane base silver paint, is selectively sprayed, silk screened, or applied using another method and cured, e.g., dried, to form conductive shield layer 1894. In another embodiment, an electrically conductive coating is non-selectively applied and patterned to form conductive shield layer 1894.

Further, interconnection balls 342 are formed within lower solder mask openings 136 and on respective terminals 134. Interconnection balls 342 include a first interconnection ball 342A and a second interconnection ball 342B. Interconnection ball 342A is formed within lower solder mask opening 136A and on terminal 134A. Similarly, interconnection ball 342B is formed within lower solder mask opening 136B and on terminal 134B. Interconnection balls 342 are optional and in one embodiment are not formed.

As set forth above, conductive shield layer 1894 is electrically connected to respective terminals 134 including terminal 134C of lower traces 120 exposed through lower solder mask openings 1692.

In one embodiment, one or more of the respective terminals 134, e.g., terminal 134C, and thus conductive shield layer 1894 are electrically connected to a reference voltage source, e.g., ground. For example, terminal 134C is electrically connected to terminal 134B by lower trace 120D as discussed above. Interconnection ball 342B formed on terminal 134B is electrically connected to a reference voltage source, e.g., ground, thus grounding conductive shield layer 1894. Accordingly, conductive shield layer 1894 forms a shield that shields electronic component 104 from EMI or RFI from below.

Further, conductive shield layer 1894 provides a ground plane below lower traces 120, i.e., only separated by lower solder mask 132. This facilitates impedance matching of signals on lower traces 120. Further, this allows stripline routing of lower traces 120. In another embodiment, for a given impedance, the width of lower traces 120 can be reduced when conductive shield layer 1894 is provided allowing more robust routing of lower traces 120.

Further, in accordance with one embodiment, conductive shield layer 1894 has a relatively high thermal conductivity. Accordingly, heat generated by electronic component 104 is transferred to conductive shield layer 1894 and dissipated to the ambient environment. Conductive shield layer 1894 is sometimes called a heat slug in accordance with this embodiment.

As set forth above, conductive shield layer 1894 covers the inner portion of lower solder mask 132. More particularly, conductive shield layer 1894 covers the inner portion of lower solder mask 132 inward of lower solder mask openings 136. Accordingly, an outer periphery 132OP of lower solder mask 132 is not covered by conductive shield layer 1894 and is exposed. However, as discussed below in reference to FIGS. 20 and 21, in another embodiment, conductive shield layer 1894 extends entirely outwards and to sides 1325 of lower solder mask 132 and thus covers outer periphery 132OP of lower solder mask 132.

Figure 20:
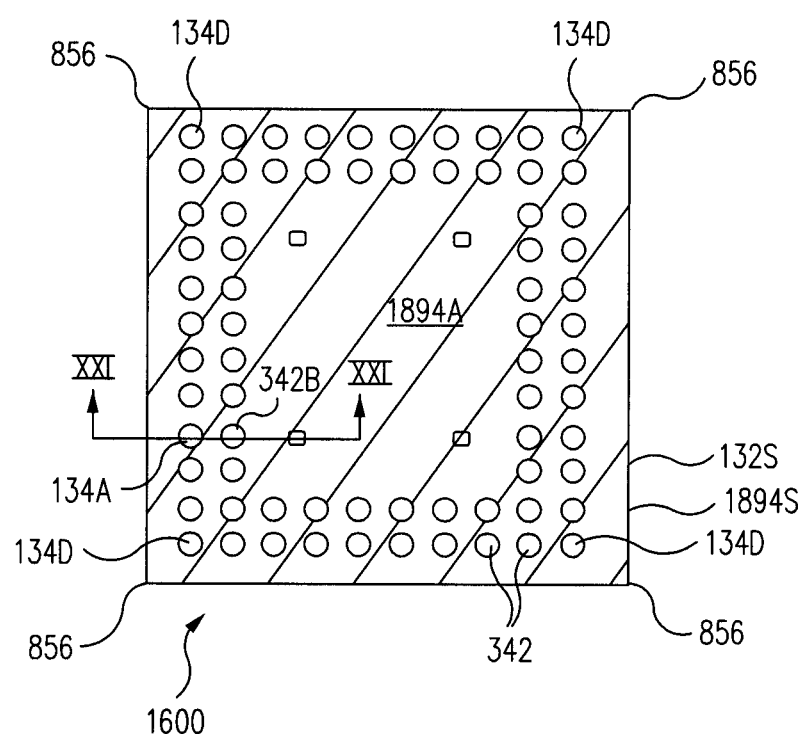
FIG. 20 is a bottom perspective view of the shielded electronic component package of FIG. 16 at a later stage during fabrication in accordance with another embodiment.
Figure 21:
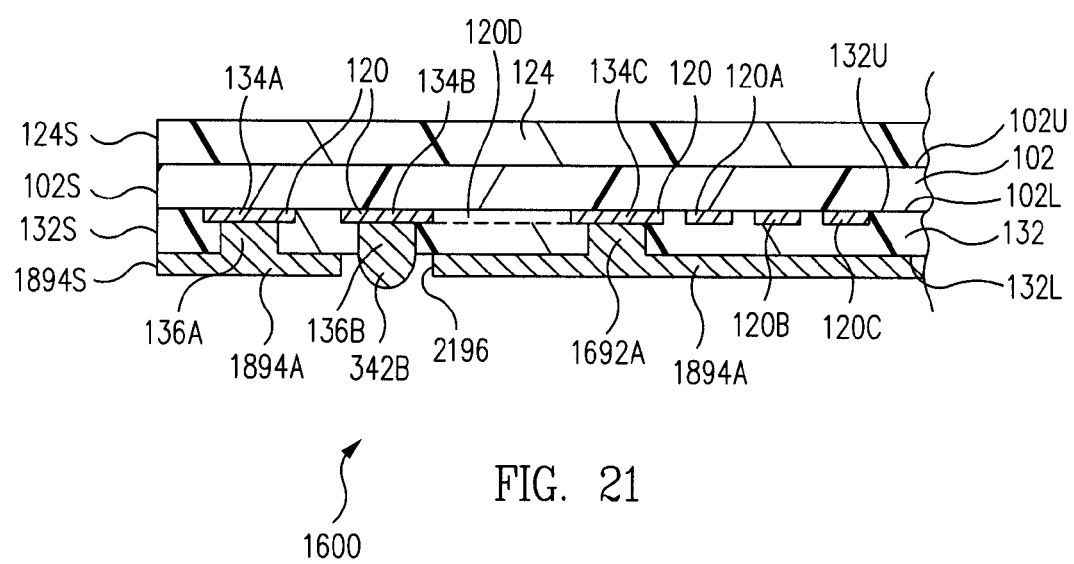
FIG. 21 is a cross-sectional view of the shielded electronic component package along the line XXI-XXI of FIG. 20 in accordance with one embodiment.

FIG. 20 is a bottom perspective view of shielded electronic component package 1600 of FIG. 16 at a later stage during fabrication in accordance with another embodiment. FIG. 21 is a cross-sectional view of shielded electronic component package 1600 along the line XXI-XXI of FIG. 20 in accordance with one embodiment. Shielded electronic component package 1600 of FIGS. 20 and 21 is similar to shielded electronic component package 1600 of FIGS. 18 and 19 and only the significant differences are discussed below.

In accordance with this embodiment, shielded electronic component package 1600 includes a conductive shield layer 1894A. Conductive shield layer 1894A is similar to conductive shield layer 1894 as discussed above in reference to FIGS. 18 and 19 and only the significant differences are discussed below. More particularly, conductive shield layer 1894A covers the entire exposed lower surface 132L of lower solder mask 132 and extends to sides 1325 of lower solder mask 132. Conductive shield layer 1894A may include sides 1894S parallel to and coplanar with sides 132S of lower solder mask 132.

Paying particular attention to FIG. 21, in accordance with this embodiment, conductive shield layer 1894A is patterned around lower solder mask openings 136. More particularly, conductive shield layer 1894A is formed with interconnection ball openings 2196 that are formed around lower solder mask openings 136 and interconnection balls 342. In this manner, shorting between interconnection balls 342 and conductive shield layer 1894A is prevented. For example, lower land opening 2196 as illustrated in FIG. 21 is formed around lower solder mask opening 136B to expose lower solder mask opening 136B and prevent shorting between conductive shield layer 1894A and interconnection ball 342B.

Optionally, as also illustrated in FIG. 21, one or more of lower solder mask openings 136 are filled with conductive shield layer 1894A to electrically connect conductive shield layer 1894A to the respective terminal 134 exposed through lower solder mask opening 136. For example, lower solder mask openings 136A is filled with conductive shield layer 1894A to electrically connect conductive shield layer 1894A to terminal 134A.

In one embodiment, terminal 134A is a ground terminal to which ground is supplied. By connecting conductive shield layer 1894A, which is grounded, to terminal 134A, terminal 134A is supplied with ground. Further, formation of an interconnection ball on terminal 134A is avoided thus simplifying manufacturing.

Although terminal 134A is illustrated at a particular location in FIGS. 20, 21, in other embodiments, other terminals 134 are electrically connected to conductive shield layer 1894A by filling the respective lower solder mask opening 136 with conductive shield layer 1894A. For example, the four terminals 134D located adjacent corners 856 of substrate 102 are electrically connected to conductive shield layer 1894A. In another embodiment, conductive shield layer 1894A is patterned around every lower solder mask opening 136 and thus is electrically isolated from all of the respective terminals 134.

Although the fabrication of electronic component packages 100, 700, 700A, 800, 900, 1400, 1600 individually is described above, in other embodiments, electronic component packages 100, 700, 700A, 800, 900, 1400, 1600 are fabricated in a strip, panel or array form. More particularly, conductive shield layers 340, 340A, 340B, 1894, 1894A, sometimes called conductive coatings, conductive coating features 1158, 1160, 1162, 1162A, 1482, or combinations thereof, can be applied while electronic component packages 100, 700, 700A, 800, 900, 1400, 1600 are in a strip, panel or array form. The strip, panel, or array is later singulated to form singulated electronic component packages 100, 700, 700A, 800, 900, 1400, 1600.

Although specific embodiments were described herein, the scope of the invention is not limited to those specific embodiments. Numerous variations, whether explicitly given in the specification or not, such as differences in structure, dimension, and use of material, are possible. The scope of the invention is at least as broad as given by the following claims.

What is claimed is:

1. An electronic component package comprising:
   a substrate comprising a first surface;
   a terminal coupled to the first surface;
   a solder mask comprising a first surface in direct contact with the first surface of the substrate, the solder mask comprising a solder mask opening exposing at least a portion of the terminal; and
   an electrically conductive paint in direct contact with a second surface of the solder mask and electrically connected to the terminal, the solder mask opening extending between the second surface of the solder mask and the terminal, wherein the conductive paint completely fills the solder mask opening to contact the terminal.

2. The electronic component package of claim 1 further comprising:
   an electronic component;
   an adhesive mounting an inactive surface of the electronic component to the solder mask;
   a first trace coupled to the first surface of the substrate;
   a bond wire coupling a bond pad on an active surface of the electronic component to the first trace; and a package body enclosing the electronic component and the bond wire, wherein the conductive paint encloses the package body.

3. The electronic component package of claim 1 further comprising:
an electronic component;
flip chip terminals coupled to the first surface of the substrate;
flip chip bumps coupling bond pads on an active surface of the electronic component to the flip chip terminals; and
an underfill enclosing the flip chip bumps, wherein the conductive paint encloses an inactive surface, sides of the electronic component and the underfill.

4. The electronic component package of claim 3 further comprising:
at least one via extending between the active surface and the inactive surface of the electronic component, wherein the conductive paint contacts the via.

5. The electronic component package of claim 1 wherein the conductive paint encloses an inner portion of the solder mask, an outer periphery of the solder mask being uncovered by the conductive paint and exposed.

6. The electronic component package of claim 1 wherein the conductive paint extends to sides of the solder mask, the electronic component package further comprising a lid mounted to the conductive paint.

7. The electronic component package of claim 1 wherein the conductive paint comprises a die attach area opening for mounting of an electronic component.

8. The electronic component package of claim 1 further comprising electrically conductive traces coupled to the first surface of the substrate, the traces comprising a first trace, and a second trace comprising the terminal, the second trace being electrically isolated from the first trace, the solder mask electrically isolating the conductive paint from the first trace.

9. The electronic component package of claim 1 wherein the solder mask opening comprises a ground solder mask opening, the solder mask further comprising solder ball solder mask openings.

10. The electronic component package of claim 9 further comprising interconnection balls in the solder ball solder mask openings, wherein the conductive paint comprises interconnection ball openings around the interconnection balls, the interconnection ball openings preventing shorting of the conductive paint and the interconnection balls.

11. The electronic component package of claim 9 wherein the conductive paint extends into at least one of the solder ball solder mask openings to be connected to a respective terminal exposed therethrough.

12. An electronic component package comprising:
a substrate comprising a first surface;
a solder mask comprising a first surface in direct contact with the first surface of the substrate;
an electrically conductive paint in direct contact with a second surface of the solder mask opposite the first surface of the solder mask;
an electronic component;
an adhesive mounting an inactive surface of the electronic component to the first surface of the substrate;
a first trace coupled to the first surface of the substrate;
a bond wire coupling a bond pad on an active surface of the electronic component to the first trace;
a package body enclosing the electronic component and the bond wire, wherein the conductive paint defines a shielded compartment in which the electronic component is located; and
a second trace comprising a terminal coupled to the first surface of the substrate, the second trace being electrically isolated from the first trace, wherein the conductive paint is electrically connected to the terminal by completely filling a solder mask opening in the solder mask.

13. The electronic component package of claim 12 wherein the package body comprises a principal surface and sides both in direct contact and enclosed within the conductive paint.

14. The electronic component package of claim 12 wherein the conductive paint comprises urethane base silver paint.

15. The electronic component package of claim 12 wherein the conductive paint encloses an inner portion of the solder mask, an outer periphery of the solder mask being uncovered by the conductive paint and exposed.

16. An electronic component package comprising:
a substrate comprising a first surface;
a solder mask comprising a first surface in direct contact with the first surface of the substrate;
an electrically conductive paint in direct contact with a second surface of the solder mask opposite the first surface of the solder mask;
an electrically conductive first trace coupled to the first surface of the substrate, the solder mask electrically isolating the conductive paint from the first trace; and
a second trace comprising a terminal coupled to the first surface of the substrate, the second trace being electrically isolated from the first trace, wherein the conductive paint is electrically connected to the terminal by completely filling a solder mask opening in the solder mask.

17. The electronic component package of claim 16 wherein the conductive paint comprises a ground plane for the conductive first trace.

18. The electronic component package of claim 17 wherein the conductive paint is separated from the conductive first trace only by the solder mask.

* * * * *